United States Patent [19]

Quinn

[11] 3,980,553
[45] Sept. 14, 1976

[54] AUTOMATIC FEEDING AND SORTING EQUIPMENT FOR ELECTRICAL COMPONENTS

[75] Inventor: Peter W. Quinn, Danbury, Conn.
[73] Assignee: Lorlin Industries Inc., Danbury, Conn.
[22] Filed: May 9, 1975
[21] Appl. No.: 576,157

[52] U.S. Cl. .............................. 209/73; 209/81 R; 209/74 M
[51] Int. Cl.² ............................................ B07C 5/08
[58] Field of Search ........... 209/81 R, 73, 74, 74 M, 209/75

[56] References Cited
UNITED STATES PATENTS

| 2,016,455 | 10/1935 | Purdy | 209/81 R |
|---|---|---|---|
| 3,662,881 | 5/1972 | Fineran | 209/81 R |
| 3,716,134 | 2/1973 | Campbell et al. | 209/81 |
| 3,750,878 | 8/1973 | Atchley et al. | 209/81 |
| 3,810,540 | 5/1974 | Georges | 209/81 |
| 3,847,283 | 11/1974 | Squires | 209/74 M |

*Primary Examiner*—Allen N. Knowles
*Attorney, Agent, or Firm*—Anthony J. Casella

[57] ABSTRACT

An automatic testing machine which picks up electrical components such as transistors from a feed mechanism and feeds them to spaced clamped positions at the periphery of a test wheel. The test wheel is turned by a stepper motor and the electrical devices are tested at one or more positions by clamping their terminals between two jaws, which contain contact fingers connected to test circuits. After testing, the results are registered in an electronic memory circuit and made available for a sorting action. A series of chutes and bins is positioned around the test wheel and the tested devices are discharged into the bins according to the results of the tests. A fast stepping motor and a low inertia test wheel permit test proceedures of high speed.

10 Claims, 12 Drawing Figures

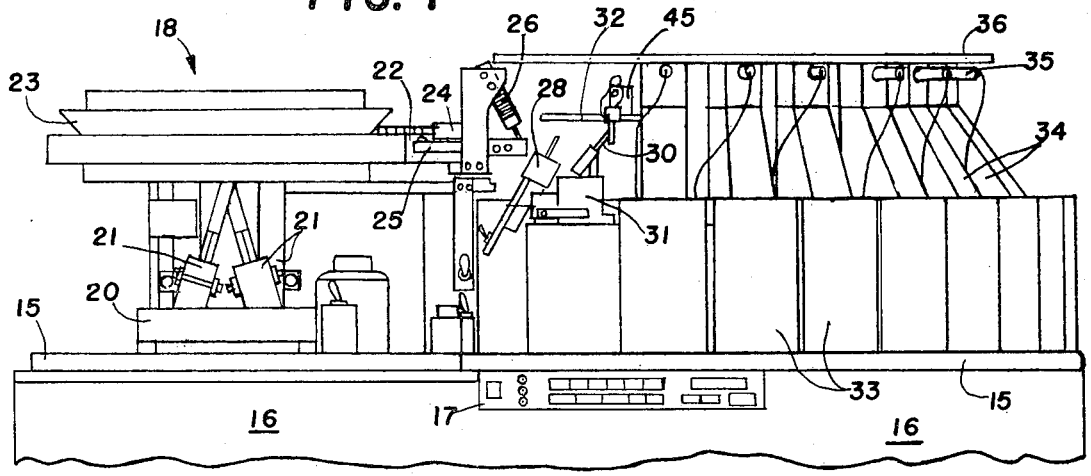
FIG. 1
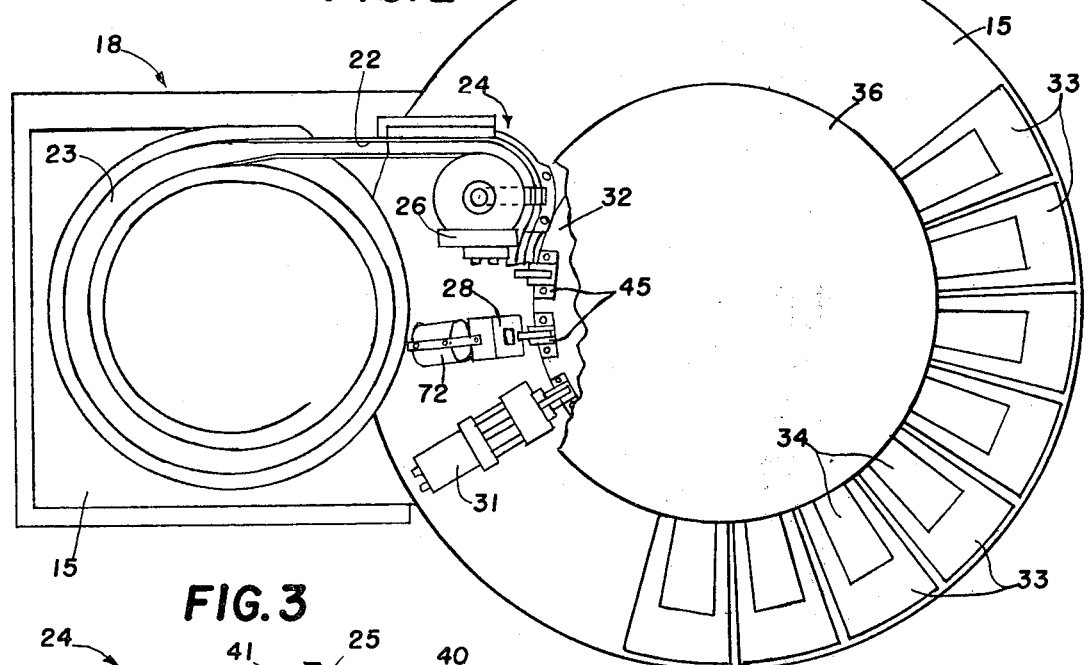
FIG. 2
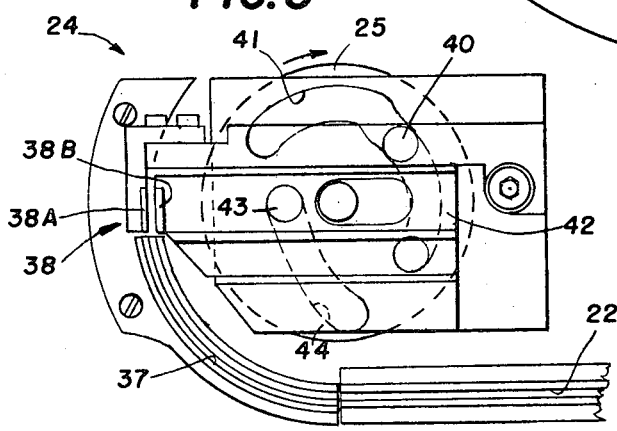
FIG. 3
FIG. 4

U.S. Patent    Sept. 14, 1976    Sheet 3 of 4    3,980,553
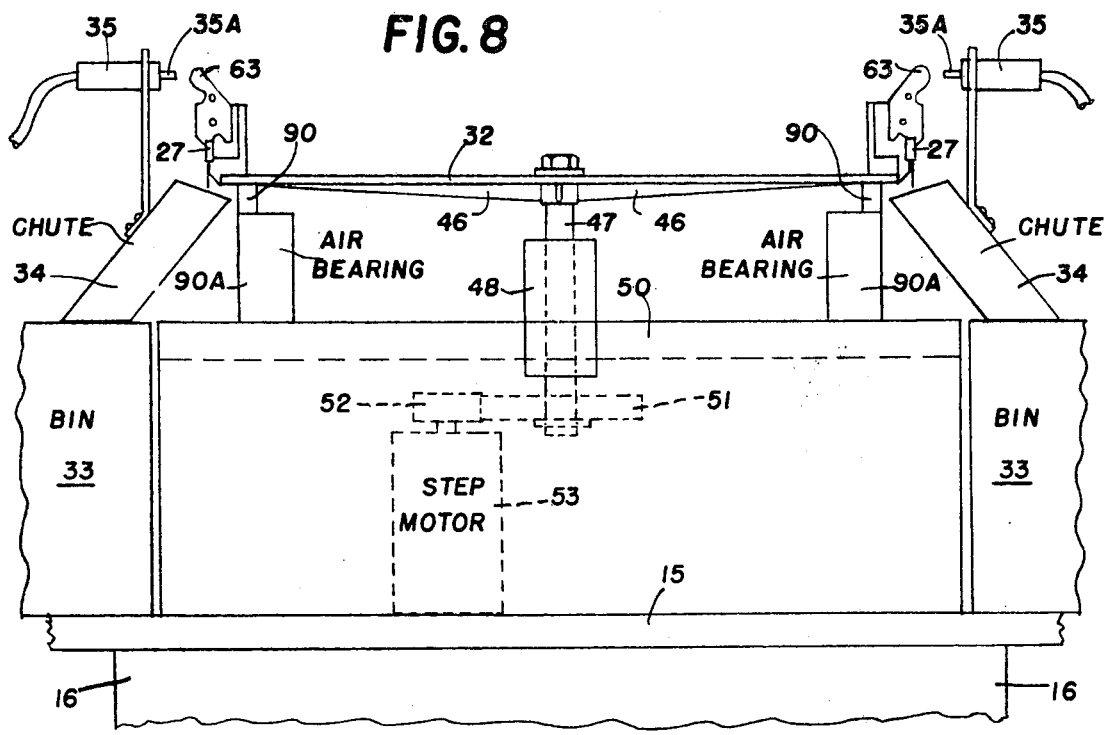
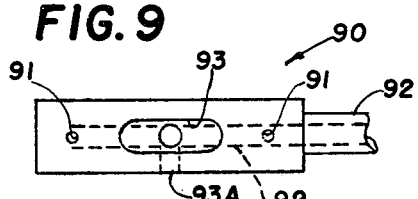
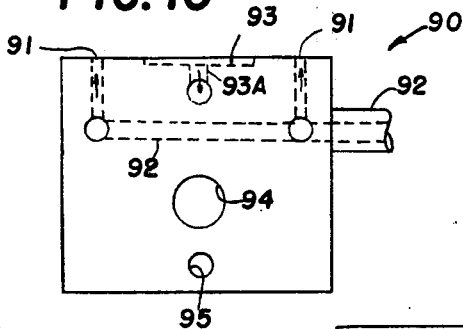
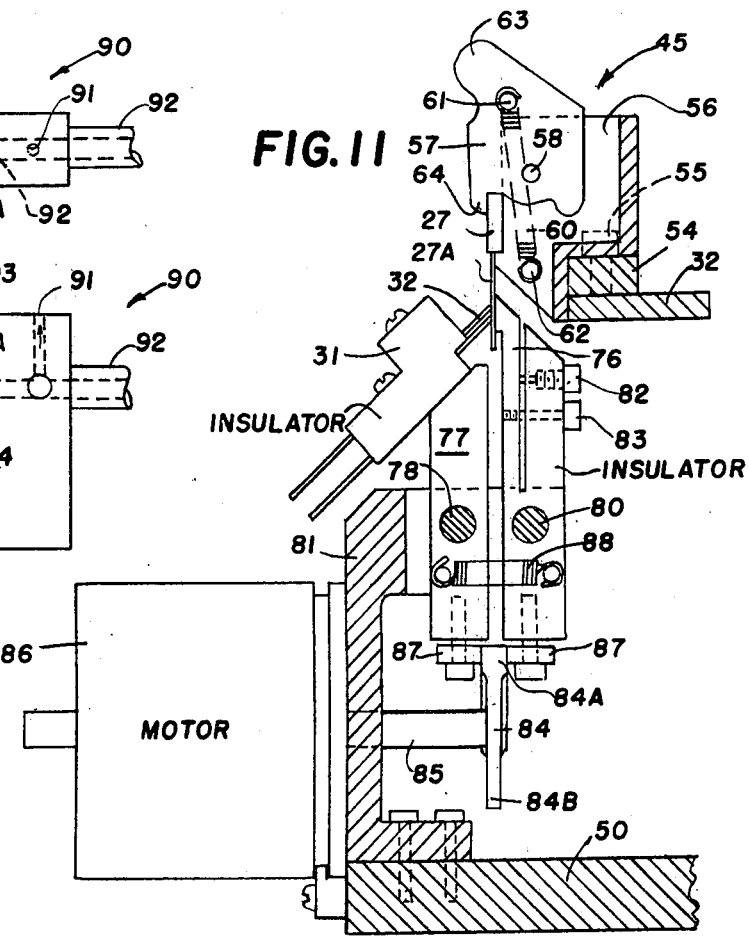

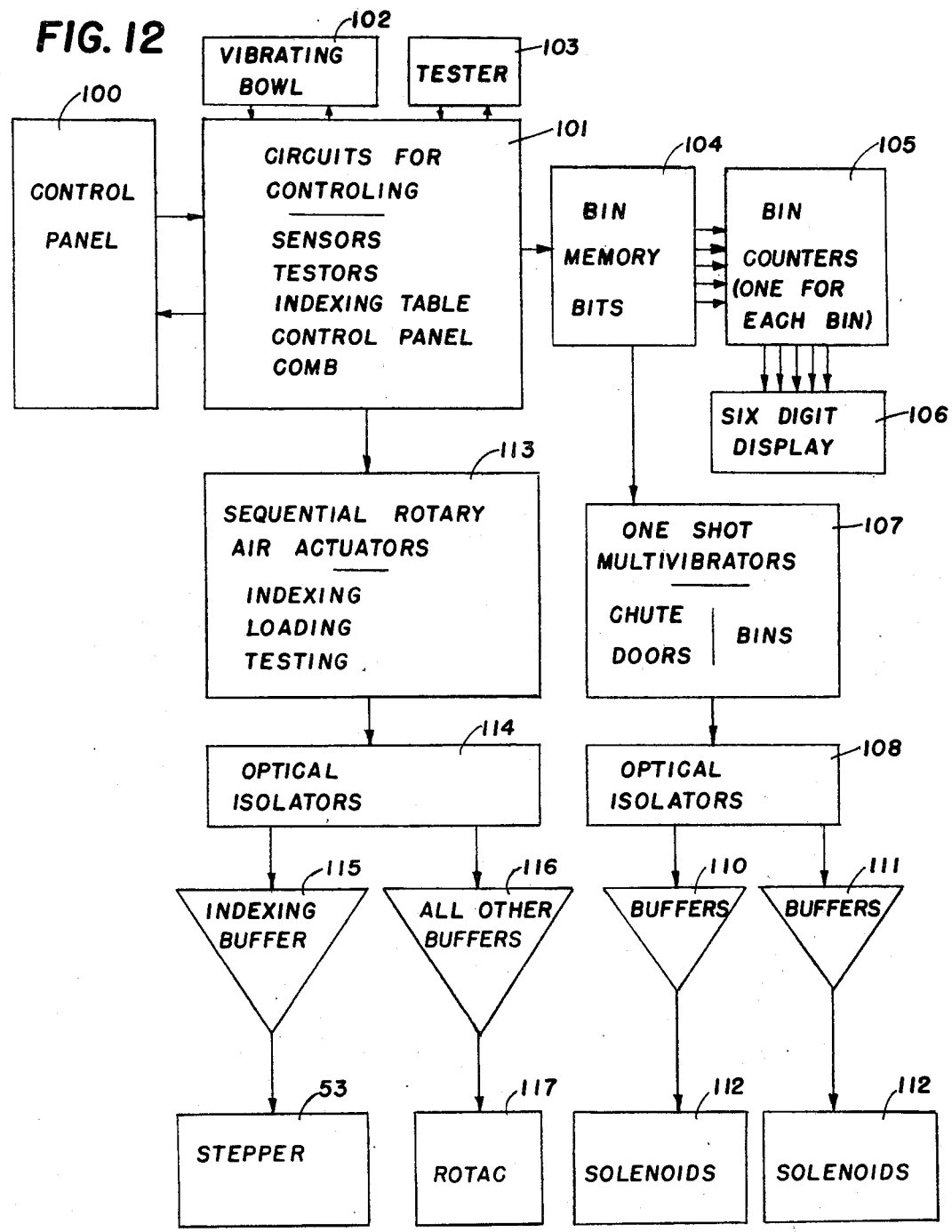

3,980,553

AUTOMATIC FEEDING AND SORTING EQUIPMENT FOR ELECTRICAL COMPONENTS

BACKGROUND OF THE INVENTION

Equipment for automatically testing transistors is known, however such equipment primarily comprises heavy mechanical systems for handling the electrical components whereby the speed of operation of the equipment is limited.

The present invention is entirely automatic. The electrical components are fed into the machine, the tests are performed and the sorting action is controlled only by set standards in a memory circuit. During the operation, an operator may depress a readout button and observe a series of digits indicating the number of devices in any selected bin.

One of the features of the invention is the speed with which the devices are tested and sorted. Another feature of the invention is the reliable results obtainable with the equipment, leaving none of the test and sorting operations to human observation. Another feature is the design of the subject apparatus which results in a more rapid handling and testing of the electrical components than heretofore known.

SUMMARY

The invention comprises a testing and sorting machine for processing components responsive to electrical test results and comprises an alignment and feeding means for moving a plurality of devices into a test position. A testing wheel is employed for supporting the devices during a test and sorting operation. Holding means, including a clamping finger, secures each of said devices to the edge of the testing wheel in a test position and a stepper motor is coupled to the testing wheel for moving it by angular increments, thereby advancing the devices through loading, test, and sorting positions. A test circuit includes input terminals for making contact with a devices and for determining a value responsive to the test results. A memory circuit is connected to the test circuit for storing the results of the testing operation and a sorting means responsive to the memory circuit sorts the devices into bins.

Additional details of the invention will be disclosed in the following description, taken in connection with the accompanying drawings.

BRIEF DESCRIPTION OF THE FIGURES

FIG. 1 is a side view of the testing and sorting machine showing the vibration hopper, the loading space and the sorting bins. Some parts have been removed for the sake of clarity.

FIG. 2 is a top view of the machine shown in FIG. 1.

FIG. 3 is a top view of the device loading station showing the cam wheel.

FIG. 4 is a side view of a typical device such as a transistor used in the testing and sorting machine.

FIG. 8 is a side view of the testing wheel with only two loading means in order to show the positions of the air bearings, the discharge solenoids, the chutes, and the bins.

FIG. 9 is a top view of one of the air bearings showing the air exit ports.

FIG. 10 is a side view of the air bearing shown in FIG. 9.

FIG. 11 is a side view, with some parts in section, of the testing circuit input means showing how the input terminals are applied to the transistor leads.

FIG. 12 is a block diagram of connections of the testing circuit.

DESCRIPTION OF THE PREFERRED EMBODIMENT

Figure 5:
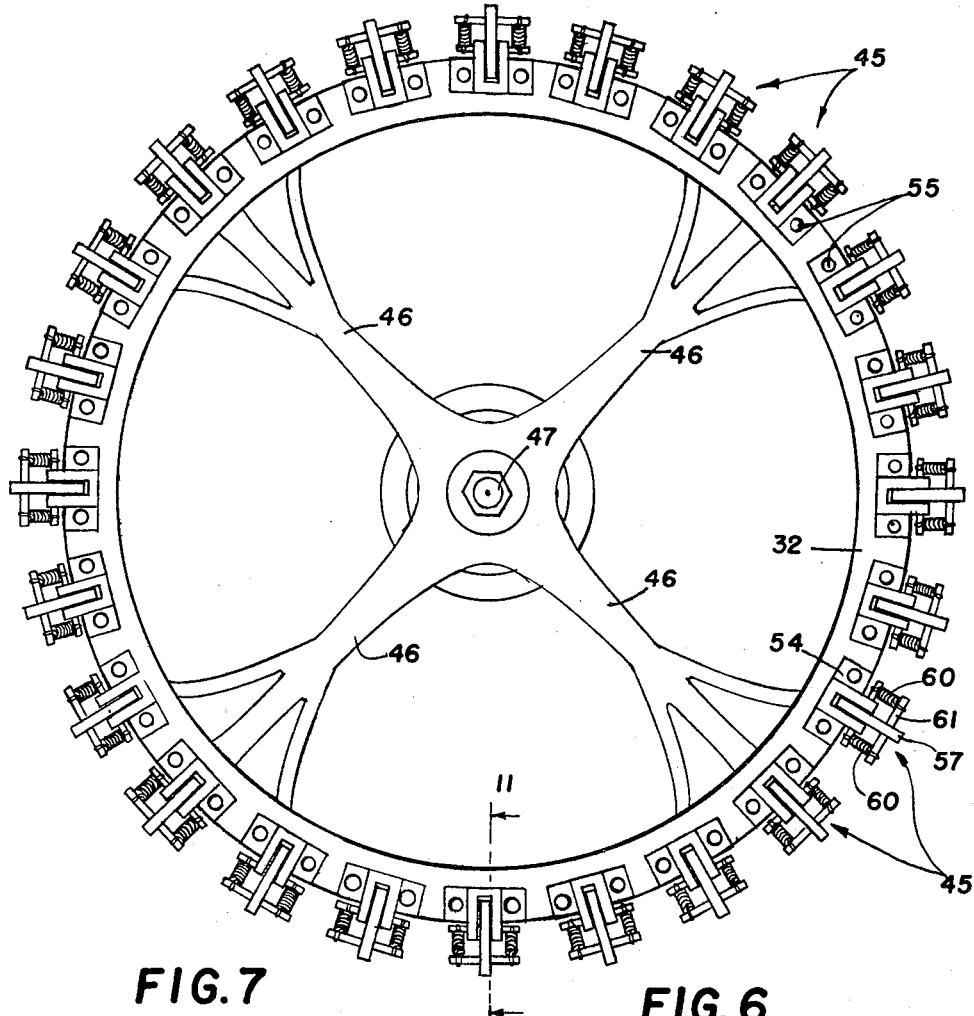
FIG. 5 is a top view of the testing wheel showing 30 loading means.

Referring now to FIGS. 1 and 2, the testing and sorting machine includes a base member 15 supported above a cabinet 16 which contains all the testing and sorting circuits. A panel board 17 is mounted on the cabinet 16 containing most of the control switches and readout devices which show the results of the tests. A circular aligning and feeding hopper 18 is mounted on a heavy base plate 20 and includes four vibrating devices 21 for imparting a non-linear vibratory movement to the hopper 18 and its output channels. The hopper 18 is a well known device and can be purchased commercially. Its non-linear movement moves the transistors from its base area, toward its periphery, then up along the inclined spiral channels, and finally through an output channel 22. During the travel toward the output channel 22 a portion 23 of the channel is set at an angle of about 45 degrees so that the transistors will assume a vertical position with the terminal leads pointing down.

Adjoining the output channel 22 is a loading device 24 including a cam wheel 25. This device is an important part of the invention and will be described in detail hereinafter.

Adjacent to the loading device 24 is an optical sensor 26 comprising an optical system which shines a beam of light on the top portion of the clamping finger. If a return beam is sensed, the loading operation continues because a return beam indicates that the clamping finger is in its proper position and is ready to grasp the next transistor 27 (FIG. 4).

At the next station, a lead straightening device 28 is positioned for operating a minature comb to straighten the transistor leads 27A and position them for contract with the test leads. The straightener 28 operates on every set of transistor leads whether straight or not.

Adjacent to the straightener device 28 are the input terminals 30 of a test circuit 31 which is connected to testing equipment in other parts of the cabinet 16. Details of this device 31 are shown in FIG. 11 which will be described later. The loader 24, straightener 28, and test circuit 31 are all mounted on a circular portion of base 15 which also supports the testing wheel 32 and a plurality of bins 33 for receiving the tested transistors. Above each bin is a chute 34 which is employed to direct the discharged transistors into its associated bin 33. The testing wheel 32, the transistor clamps, and a set of discharge solenoids 35 are all covered by a protective flat cover plate 36.

Figure 6:
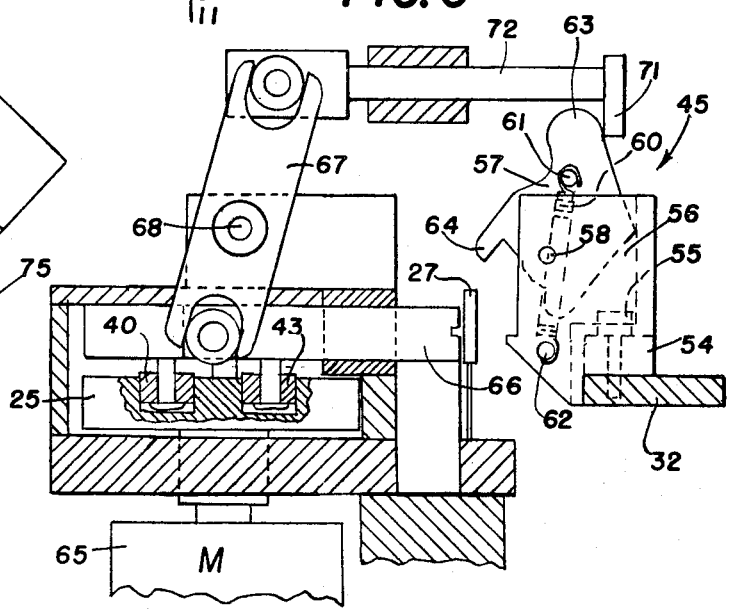
FIG. 6 is a side view with some parts in section, of a portion of the loading station showing its cooperation with the loading means.

Referring next to FIG. 3, the feeding means 24 includes a semi-circular channel 37 mounted adjoining channel 22 for receiving the transistors as they are moved from the hopper 18. Channel 37 delivers the transistors 27 to a clamp 38 comprising two jaws 38A and 38B. The outer jaw 38A is connected to a cam follower 40 which fits into a cam slot 41 on cam wheel 25. The inner jaw 38B is connected to a sliding rod 42 and a cam follower 43 which fits into another cam slot 44 on the same wheel 25. When the cam wheel 25 turns in the direction indicated by the arrow, the jaws are pulled apart permitting a transistor held by the jaws to be released and propelled by an air blast toward the loading means. When the cam wheel is in the position shown in FIG. 3, the transistor is held in place, waiting for the testing wheel to turn to a loading position. FIG. 6 shows the cam wheel in partial cross section.

FIG. 5 is a top view of the testing wheel 32 with 30 loading means 45 spaced around its periphery. Any number of loading means may be used, the total number depending upon the size of the wheel and the size of the transistors tested. The testing wheel is preferably made of aluminum with a minimum inertia so that it can be started and stopped quickly with a minimum of vibration. The wheel includes four branched spokes 46 and is supported at its center by a vertical shaft 47 (see also FIG. 8). The shaft 47 rotates within a precision bearing 48 which in turn is supported by an upper base plate 50. Shaft 47 is secured to a gear 51, coupled to a smaller gear 52 and a step motor 53 supported on base plate 15. For each step movement of the motor 53, the test wheel 32 moves a distance equal to the spacing of the loading means 45.

Details of the loading means 45 are best shown by FIGS. 6 and 11 where the base portion 54 of the loader is secured to the rim of wheel 32 by two bolts 55. Integrally formed with the base 54 is a vertical slot 56 in which a pawl 57 is rotatably mounted. The pawl 57 turns on a horizontal shaft 58 and is resiliently held by a helical spring 60. The upper end of spring 60 is secured to a first cross bar 61 and the pawl 57; the lower end of the spring is secured to a second cross bar 62 and the lower portions of slot 56. The positions of the shaft 58 and bars 61 and 62 forms a toggle action joint so that the pawl 57 is stable in either one of two positions, shown in FIGS. 6 and 11. The pawl 57 is formed with an upwardly extending stub arm 63 which is used as a short lever for positioning the pawl by other means. A clamping finger 64 is also made part of the pawl 57 and engages the upper portion of a transistor 27 when clamped for test purposes.

The mechanism shown in FIG. 6 illustrates the action of transferring a transistor 27 from jaws 38A and 38B to the loading means 45. As cam wheel 25 is turned by the air rotor 65, the jaws 38 are opened, the transistor is moved to the position shown in FIG. 6 and a blast of air plus the movement of rod 66 forces the transistor toward the loading means 45. At the same time lever 67, pivoted on a shaft 68, moves a rod 70 to the left and a disk 71 at its end engages the stub arm 63 to rotate the pawl 57 and lower finger 64 to grasp the transistor and hold it firmly in place during the testing cycle. After this operation, the pawl 57 and transistor 27 are in the positions shown in FIG. 11.

Figure 7:
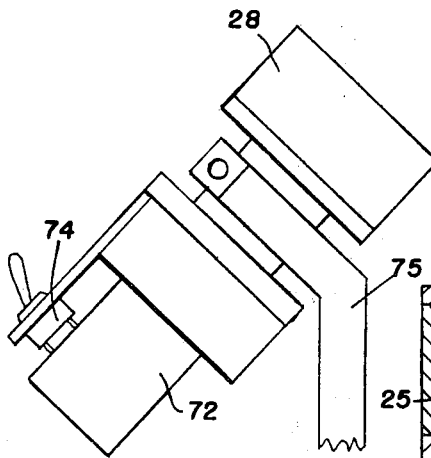
FIG. 7 is a side view of a comb device for straightening the transistor leads prior to testing.

The testing wheel 32 next moves one increment to move the transistor 27 to a lead straightening position. An air rotor 72 (FIG. 7) is energized and a comb wrthin lead straightening means 78 is moved into contact with the three depending conductors 27A and forces them into a flat shape suitable for connection with the contact arms 30 of the testing equipment. The straightening device 28 may not always be necessary, depending upon the type of transistor used and, when not in service, a switch 74 is moved to the OFF position, disabling this equipment. The lead straightening means 28 is supported by bent bar 75 bolted to the upper base member 50.

The test fingers 30 and a back-up member 76 are shown in detail in FIG. 11. There are six contact fingers 30 arranged to wipe the surface of the transistor conductors 27A to give a low ohmage joint. The fingers 30 are held in an insulator block 31 bolted to a rockable rod 77 which moves about a stub shaft 78. The back-up member 76 is also rockable about a similar stub shaft 80, both stub shafts secured to a C-shaped bracket 81 bolted to the upper base 50. The back-up member 76 is adjustable to provide a desired pressure on the transistor leads 27A. The adjustment can be made by a slot in the member whose width is controlled by two bolts 82 and 83. The relative positions of rod 77 and back-up member 76 are controlled by a cam wheel 84 mounted on a horizontal shaft 85 and turned by a step motor 86, also mounted on the bracket 81.

The cam wheel moves between two rotatable cam followers 87 mounted on the lower ends of members 76 and 77. A portion of the cam wheel 84A is wide enough to force the lower ends of the members 76 and 77 apart sufficiently to produce a pinching action on the transistor leads. When the thin portion 84B of the cam wheel is between the cam followers 87, a helical spring 88 pulls the lower ends of members 76 and 77 together and separates the upper ends so that the transistor leads 27A are free to be moved to a new position by wheel 32. It should be noted that a small resilient action is available in back-up insulator 76 since it is thin enough to be bent a small amount when the upper ends of the members 76, 77 are moved together. Also, contact terminals 30 are resilient and produce a small wiping action on contact sufficient to remove any dirt from the transistor leads 27A as contact is made.

In order to produce a fast acting machine, the testing wheel 32 is made of light weight material and is supported at its periphery by two air bearings 90, positioned adjacent to the underside of the wheel and supported by base members 90A. The base members include valves, a constant pressure regulator, and an air filter. Details of the air bearing are shown in FIGS. 9 and 10 where two exit ports 91 are spaced openings for the escape of air under pressure. The under surface of test wheel 32 is positioned just above the top surface of the air bearing as shown in FIG. 10 and is supported in part by the air stream from the two jets. Exit ports 91 are connected to a common supply line 92 which is connected to a source of air under controlled pressure. Midway between the two exit ports 91 is a shallow depression 93, part of an entrance port 93A which is connected to a vacuum pump or source of air under reduced pressure. About half of the air moving out through ports 91, moves into the depression 93 and out through conduit 93A. This air passes under the lower surface of test ring 32, the air from the two ports 91 moving in opposite directions and effectively dampening any vibration of the wheel 32 as it is started and stopped by the stepper motor 53. Mounting holes 94 and 95 are used to secure the bearings 90 to the bases 90A.

The operation of the device has been indicated, in part by the above description of the apparatus. The transistors to be tested are dumped at random into the center of the hopper 18 and the vibrators 21 energized. The biased vibrations of the hopper and its connected channels move the transistors from the hopper to the circular channels 23, out to the exit channel 22, around the cam wheel 24 and into a loading position shown in detail in FIG. 6. Next, a control signal operates the cam wheel and a transistor is loaded into a loader 45 secured to the testing wheel 32. Wheel 32 is now advanced one increment space and another transistor is loaded, the first transistor now being in front of the straightening device 28. After a straightening operation, the wheel 32 again moves the first loaded transistor to the electrical test position where an air rotor 86 operates to clamp the transistor between members 76 and 77. A number of electrical tests are now made on the transistor to determine its characteristics.

The testing circuits associated with this phase of the operation are well known in the art and need not be described in detail. The testing circuits are not a part of the invention.

The results of the tests are stored in a memory circuit having as many storage sections as there are loading positions on the test wheel 32. These results are retained in the sections until the transistors are ejected into the proper sorter bins 33.

The stepping motion of the test wheel continues; at each step a transistor is loaded onto a loading position of the test wheel, and at each step the results of the memory are applied to the bin positions to determine if the recorded amounts agree with the bin specifications. If there is a comparison within the limits, the ejectors 35 are actuated and the shaft 35A moves to turn the pawl 57 of the loader 45 to eject the transistor into the adjoining bin 33. An air blast also is directed to the back of the transistor to make sure the transistor leaves the wheel.

The arrangement of control activating and readout circuits is shown in block form in FIG. 12. A control panel 100 contains the usual supply switches for activating the electrical circuits. The control panel components are connected to a major control circuit 101 which supplies the proper electrical current waves to the vibrators 21 for vibrating the bowl or hopper means 102. Current is also supplied from circuit 101 to the tester circuit 103 which makes the tests on the transistors while in the testing position. The results of the tests are sent to the memory circuit 104 which holds the results in a ring circuit which can be controlled by a transfer pulse to rotate the binary bit results around the ring for comparison purposes. As the transistors are sorted, a counter is actuated each time a bin receives a transistor so that a record is kept in the circuit as the sorting action proceeds. The bin counter circuits 105 are all connected (through manually operable push buttons) to a panel digit display 106 having six denominational orders so that an operator can determine, at any time, the number of sorted transistors in each bin 33.

All the circuits shown in FIG. 12 are old in the art, this portion of the machine not being part of the invention except that it collates the test results and sorts the transistors responsive to their quality.

The memory circuit 104 is also connected to a series of one shot multivibrators 107 which control the chute doors on the bins and are connected through optical sensing isolators 108 and buffer amplifiers 110 and 111 to control solenoids 112 such as solenoids 35 above each bin, air rotors 86 and 65, and solenoid 28.

Control circuit 101 is also connected to a sequential array of air actuators 113 which include the air valves which produce the air blasts for moving the transistors into and out of the loading means. The actions due this circuit 113 are relayed through optical isolators 114 to buffer amplifiers 115 and 116 and then applied to the stepper motor 53 and a rotary control means 117.

The embodiments of the invention in which an exclusive property or privilege is claimed are defined as follows:

1. A testing and sorting machine for processing electrical components responsive to electrical test results comprising: alignment and feeding means for moving a plurality of components into a test position; a testing wheel for supporting the components during a test and sorting operation, said testing wheel being supported at its periphery by at least two fluid streams moving perpendicular to the wheel surface for supporting the wheel and for dampening rotary vibrations of said wheel; a loading means including a clamping finger for securing each of said components to the edge of said testing wheel in a test position; a stepper motor coupled to the testing wheel for moving the wheel by angular increments and for advancing the components through loading, test, and sorting positions; a test circuit including input terminals for making contact with a component and for determining a value responsive to the test results; a memory circuit connected to said test circuit for storing the results of a testing operation; and, a sorting means responsive to the memory circuit for sorting the tested components into bins.

2. A machine according to claim 1 wherein said alignment and feeding means includes non-linear vibratory motor coupled to a hopper and connecting channels.

3. A machine according to claim 1 wherein the testing wheel is further subjected to the action of an air sink, including an entrance port positioned near the surface of the wheel and connected to a system containing air at reduced pressure, said air sink for reducing vibratory action of the testing wheel during periods of rotary acceleration and deceleration.

4. A machine according to claim 3 wherein said air sink is positioned between two exit ports which supply air from a source of air under pressure.

5. A testing and sorting machine for processing electrical components responsive to electrical test results comprising: alignment and feeding means for moving a plurality of components into a test position; a testing wheel for supporting the components during a test and sorting operation; a loading means including a clamping finger for securing each of said components to the edge of said testing wheel in a test position; said clamping finger being an integral part of a rotary clamp having a first stable position for clamping the component and a second stable position wherein the component is released; a stepper motor coupled to the testing wheel for moving the wheel by angular increments and for advancing the components through loading, test, and sorting positions; a test circuit including input terminals for making contact with a component and for determining a value responsive to the test results; a memory circuit connected to said test circuit for storing the results of a testing operation; and, a sorting means responsive to the memory circuit for sorting the tested components into bins.

6. A machine according to claim 5 wherein said rotary clamp is provided with an extending stub arm for contact by operating means which move the rotary clamp from one stable position to another.

7. A machine according to claim 1 wherein said stepper motor is coupled to the testing wheel by means of gears, whereby the angular motion of the testing wheel is less than the angular motion of the motor.

8. A machine according to claim 1 wherein said input terminals are applied to the electrical component leads at an angle resulting in a wiped contact.

9. A machine according to claim 1 wherein said memory circuit is a storage circuit for storing a plurality of binary bits responsive to the results of the component test.

10. A machine according to claim 9 wherein said memory circuit includes means for transferring the binary bits from one storage position to another in response to a transfer signal for sorting the electrical components.

* * * * *